United States Patent [19]

Ishimoto

[11] Patent Number: 5,475,332
[45] Date of Patent: Dec. 12, 1995

[54] POWER SOURCE CIRCUIT

[75] Inventor: Shin-ichi Ishimoto, Itami, Japan

[73] Assignee: Mitsubishi Denki Kabushiki Kaisha, Tokyo, Japan

[21] Appl. No.: 179,713

[22] Filed: Jan. 11, 1994

[30] Foreign Application Priority Data

Jan. 12, 1993 [JP] Japan .................................. 5-003236

[51] Int. Cl.$^6$ .............................................. H03K 17/687
[52] U.S. Cl. ............................ 327/427; 327/77; 327/404
[58] Field of Search ............................. 327/77, 108, 376, 327/377, 404, 530, 206, 379, 387, 391, 336, 427, 81

[56] References Cited

U.S. PATENT DOCUMENTS

| | | | |
|---|---|---|---|
| 3,720,848 | 3/1973 | Schmidt, Jr. .............................. | 307/251 |
| 3,723,763 | 3/1973 | Udovic ..................................... | 307/229 |
| 4,331,885 | 5/1982 | Amazawa et al. ....................... | 307/254 |
| 5,010,261 | 4/1991 | Steigerwald ............................. | 307/571 |
| 5,111,064 | 5/1992 | Ward ........................................ | 307/270 |
| 5,111,084 | 5/1992 | Suko ........................................ | 307/571 |

*Primary Examiner*—Timothy P. Callahan
*Assistant Examiner*—My-Trang Nu Ton
*Attorney, Agent, or Firm*—Leydig, Voit & Mayer

[57] ABSTRACT

A main P-channel field effect transistor 1 exhibiting a larger current driving capacity and an auxiliary P-channel field effect transistor 8 exhibiting a smaller current driving capacity are coupled in parallel across the input terminal 2 and the output terminal 3. When a voltage is applied on the input terminal 2, the output of the comparator 7 falls to the low level L, and the auxiliary P-channel field effect transistor 8 is first turned on. Since the current driving capacity of the auxiliary P-channel field effect transistor 8 is small, the voltage at the output terminal 3 rises gradually at a limited rate. When the voltage at the output terminal 3 exceeds a predetermined level, the output of a second comparator 9 falls to the low level L, and thereby turns on the main P-channel field effect transistor 1.

9 Claims, 3 Drawing Sheets

POWER SOURCE CIRCUIT

BACKGROUND OF THE INVENTION

This invention relates to power source circuits for supplying source power or voltage to semiconductor devices such as memory ICs (integrated circuits).

FIG. 6 is a circuit diagram showing the structure of a conventional power source circuit. A P-channel field effect transistor 1 is coupled across an input terminal 2 and an output terminal 3. Serially connected resistors 4 and 5 are coupled across the input terminal 2 and a grounded terminal 6. The inverted input terminal of a comparator 7 is coupled to the junction point between the resistors 4 and 5, the non-inverted input terminal thereof being coupled to a constant voltage source 10. The output terminal of a comparator 7 is coupled to the gate of the P-channel field effect transistor 1.

The method of operation of the circuit of FIG. 6 is as follows. When a positive voltage is applied on the input terminal 2, the voltage applied on the inverted input terminal of the comparator 7 becomes higher than the voltage applied on the non-inverted input terminal thereof, such that the output of the comparator 7 is reduced to the low level L. As a result, the P-channel field effect transistor 1 is turned on, and the voltage applied on the input terminal 2 is output to the output terminal 3.

The conventional power source circuit of FIG. 6, however, has the following disadvantage. If the voltage applied on the input terminal 2 rises sharply, the voltage at the output terminal 3 also rises sharply. As a result, the voltage supplied to the memory IC, etc, coupled to the output terminal 3 rises abruptly. Thus the requirement for the predetermined rising rate of the power supply for the memory IC cannot be met. The memory IC may thus malfunction. Further, in the case of the memory IC which needs a backup voltage, the data stored therein may be changed or lost.

SUMMARY OF THE INVENTION

It is therefore an object of this invention to provide a power source circuit by which the voltage supplied to the memory IC, etc., coupled to the output terminal 3 rises at a predetermined limited rate even if the voltage applied on the input terminal 2 rises sharply, such that the malfunction of the memory IC is prevented and the loss of data stored therein can effectively be prevented.

The above object is accomplished in accordance with the principle of this invention by a power source circuit for supplying a voltage applied on an input terminal to an output terminal at a limited rising rate, which comprises a first transistor coupled across the input terminal and the output terminal; a second transistor coupled across the input terminal and the output terminal in parallel circuit relationship with the first transistor, the second transistor having a smaller current driving capacity than the first transistor; first control means For turning on the second transistor when the voltage upon the input terminal exceeds a first predetermined level; and second control means For turning on the first transistor when the voltage at the output terminal exceeds a second predetermined level.

Preferably, the first control means includes: a voltage detector means, coupled across the input terminal and a grounded terminal, for outputting a voltage corresponding to the voltage applied on the input terminal; a first comparator having a first input terminal coupled to an output of the voltage detector means, and a second input terminal coupled to a reference constant voltage source; wherein an output of the first comparator is coupled to a control terminal of the second transistor and turns on the second transistor when the voltage applied upon the input terminal exceeds the first predetermined voltage level. Further, it is preferred that the second transistor is a second field effect transistor and the control terminal of the second transistor is a gate terminal of the second field effect transistor.

The second control means is preferred to include: a second comparator having a first input terminal coupled to the output terminal, and a second input terminal coupled to a reference constant voltage source; wherein an output of the second comparator is coupled to a control terminal of the first transistor and turns on the first transistor when the voltage at the output terminal exceeds the second predetermined voltage level. Preferably, the first transistor is a first field effect transistor and the control terminal of the first transistor is a gate terminal of the first field effect transistor.

Further, it is preferred that the power source circuit further includes: switch means inserted between the output of the first comparator and the control terminal of the second transistor, the switch means having a control input terminal coupled to the output of the second comparator, such that the output of the second comparator turns off the switch means at the same time when the output of the second comparator turns on the first transistor. Alternatively, the power source circuit may further include: switch means inserted between the input terminal and the second transistor, the switch means having a control input terminal coupled to the output of the second comparator, such that the output of the second comparator turns off the switch means at the same time when the output of the second comparator turns on the first transistor.

A power source circuit according to this invention may include: a transistor coupled across the input terminal and the output terminal; integration circuit means, coupled across the input terminal and the output terminal, for supplying a voltage applied on the input terminal to the output terminal at a predetermined limited rising rate; control means for turning on the transistor when the voltage at the output terminal exceeds a predetermined level. Then, the power source circuit is preferred to include: switch means inserted between the integration means and the output terminal, the switch means having a control input terminal coupled to an output of the control means, such that the control means turns off the switch means at the same time when the control means turns on the transistor.

The above power source circuits may further include: a third transistor coupled serially with the first and second transistors, the third transistor preventing a reverse current flowing from the output terminal to the input terminal when turned off; wherein the first, control means turns on the second and third transistors when the voltage upon the input terminal exceeds a first predetermined level.

BRIEF DESCRIPTION OF THE DRAWINGS

The features which are believed to be characteristic of this invention are set forth with particularity in the appended claims. The structure and method of operation of this invention itself, however, will be best understood from the following detailed description, taken in conjunction with the accompanying drawings, in which:

In the drawings, like reference numerals represent like or corresponding parts or portions.

DETAILED DESCRIPTION OF THE PREFERRED EMBODIMENTS

Referring now to the accompanying drawings, the preferred embodiments of this invention are described.

Figure 1:
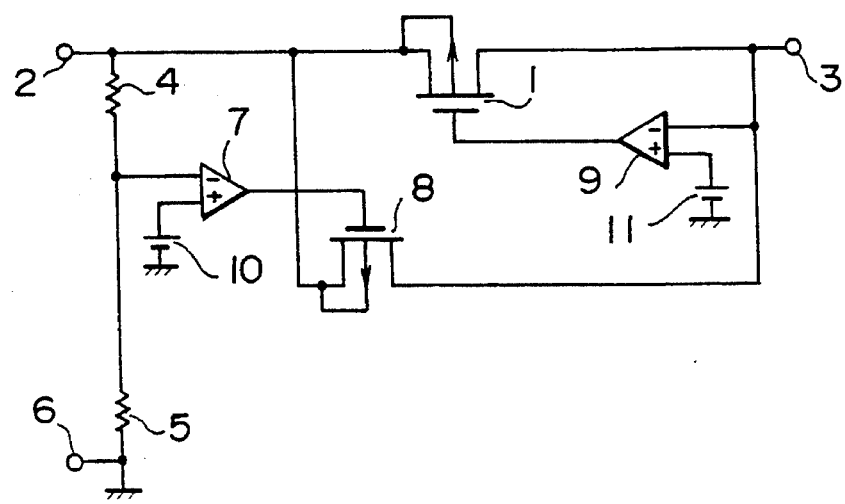
FIG. 1 is a circuit diagram showing the structure of a power source circuit according to a first embodiment of this invention.

FIG. 1 is a circuit diagram showing the structure of a power source circuit according to a first embodiment of this invention. The drain and the source terminals of a P-channel field effect transistor 1 is coupled to an input terminal 2 and an output terminal 3, respectively. Resistors 4 and 5 are coupled serially across the input terminal 2 and a grounded terminal 6. The junction point between the resistors 4 and 5 is coupled to the inverted input terminal of a comparator 7. The drain and the source terminals of a P-channel field effect transistor 8 are coupled to the input terminal 2 and the output terminal 3, respectively. The output of the comparator 7 is coupled to the gate of the P-channel field effect transistor 8. Further, the source terminal of the P-channel field effect transistor 8 is coupled to the inverted input terminal of a comparator 9, the output of the comparator 9 being coupled to the gate of the P-channel field effect transistor 1. The non-inverted input terminals of the comparators 7 and 9 are coupled to constant voltage sources 10 and 11, respectively.

By the way, the current driving capacity of the P-channel field effect transistor 8 is less than the current driving capacity of the P-channel field effect transistor 1. Namely, the current flowing through the P-channel field effect transistor 8 in the ON state is less than the current flowing through the P-channel Field effect transistor 1 in the ON state, and the rise rate of the current flowing through the P-channel field effect transistor 8 is less than that through the P-channel field effect transistor 1.

The operation of the power source circuit of FIG. 1 is as follows. When the input terminal 2 is not coupled to the power source, the P-channel field effect transistors 1 and 8 are turned off. Assume that the input terminal 2 is hereupon coupled to the power source, and the voltage applied on the input terminal 2 thus rises. Then, the voltage at the junction point between the resistors 4 and 5 rises accordingly, and the voltage applied on the inverted input terminal of the comparator 7 exceeds the voltage of the constant voltage source 10. As a result, the output of the comparator 7 falls to the low level L, and the P-channel field effect transistor 8 is turned on. Thus, the voltage applied upon the input terminal 2 begins to be supplied to the output terminal 3 through the P-channel field effect transistor 8. However, since the current driving capacity of the P-channel field effect transistor 8 is small, the voltage of the output terminal 3 rises at a predetermined limited rate, irrespective of the rising rate of the voltage applied upon the input terminal 2. The rising rate of the voltage at the output terminal 3 is limited at a predetermined level by selecting a proper level of the current driving capacity of the P-channel field effect transistor 8.

When the voltage at the output terminal 3 further rises and the voltage applied on the inverted input terminal of the comparator 9 exceeds the voltage supplied by the constant voltage source 11, the output of the comparator 9 falls to the low level L. As a result, the P-channel field effect transistor 1 is also turned on. Thus the voltage applied on the input terminal 2 is supplied to the output terminal 3 through the P-channel field effect transistor 1 having a large current driving capacity. A large output current is thus supplied to the output terminal 3 with a sufficiently small voltage drop.

Figure 2:
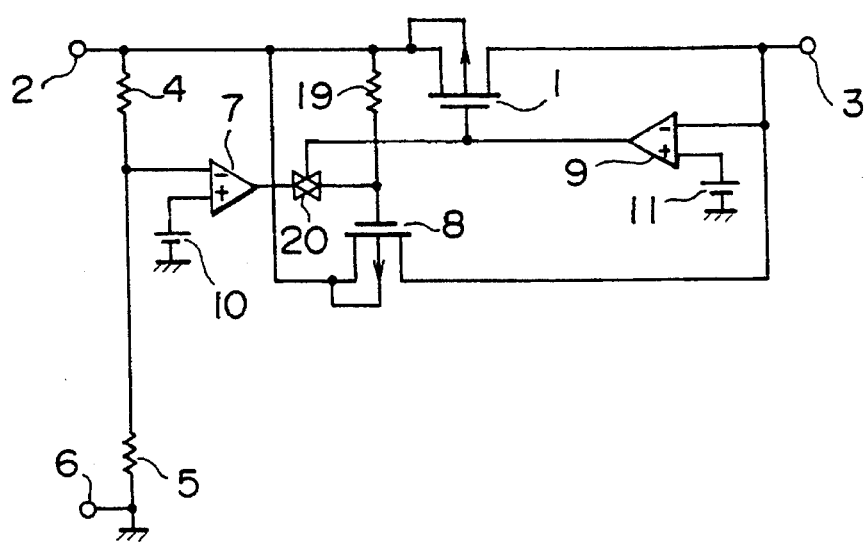
FIG. 2 is a circuit diagram showing the structure of a power source circuit according to a second embodiment of this invention.

FIG. 2 is a circuit diagram showing the structure of a power source circuit according to a second embodiment of this invention. The circuit of FIG. 2 is similar to that of FIG. 1, except for the following points. The gate of the P-channel field effect transistor 8 is coupled to the input terminal 2 through a resistor 19. Further, the output of the comparator 7 is coupled to the gate of the P-channel field effect transistor 8 through an analog switch 20. The output of the comparator 9 is coupled to the control input terminal of the analog switch 20 as well as to the gate of the P-channel field effect transistor 1.

The operation of the power source circuit of FIG. 2 is similar to that of the power source circuit of FIG. 1 until the voltage at the output terminal 3 rises to reduce the output of the comparator 9 to the low level L. Namely, when the input terminal 2 to coupled to the power source, the analog switch 20 is ON and the output of the comparator 7 is supplied to the gate of the P-channel field effect transistor 8 until the voltage at the output terminal 3 rises to reduce the output of the comparator 9 to the low level L. However, when voltage at the output terminal 3 exceeds the voltage supplied by the constant voltage source 11 and the output of the comparator 9 falls to the low level L, the analog switch 20 is turned off at the same time as the P-channel field effect transistor 1 is turned on. As a result, to the gate of the P-channel field effect transistor 8 is applied a high voltage through the resistor 19, and the P-channel field effect transistor 8 is turned off. Thus, after the voltage at the output terminal 3 rises and exceeds the voltage of the constant voltage source 11, the voltage at the input terminal 2 is supplied to the output terminal 3 exclusively through the P-channel field effect transistor 1.

Figure 3:
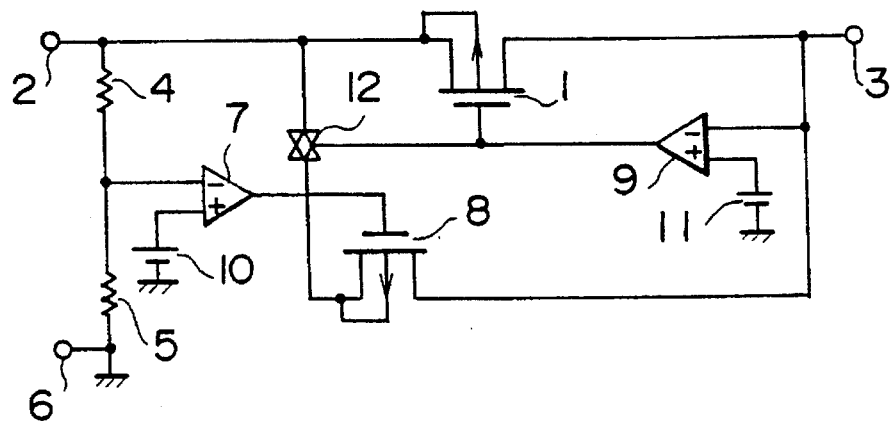
FIG. 3 is a circuit diagram showing the structure of a power source circuit according to a third embodiment of this invention.

FIG. 3 is a circuit diagram showing the structure of a power source circuit according to a third embodiment of this invention. The circuit of FIG. 3 is also similar to that of FIG. 1 except for the following points. An analog switch 12 is inserted between the input terminal 2 and the drain terminal of the P-channel field effect transistor 8. Further, the output of the comparator 9 is coupled to the control input terminal of the analog switch 12 as well as to the gate of the P-channel field effect transistor 1.

The operation of the power source circuit of FIG. 3 is also similar to that of the power source circuit of FIG. 1 until the voltage at the output terminal 3 rises to reduce the output of the comparator 9 to the low level L. Namely, until then, the analog switch 12 is ON and, when the output of the comparator 7 falls to the low level L, the voltage at the input terminal 2 is supplied to the output terminal 3 through the analog switch 12 and the P-channel field effect transistor 8. However, when the voltage at the output terminal 3 exceeds the voltage supplied by the constant voltage source 11 and the output of the comparator 9 falls to the low level L, the analog switch 12 is turned off as the P-channel field effect transistor 1 is turned on. Thus, after the voltage at the output terminal 3 rises and exceeds the voltage of the constant voltage source 11, the voltage at the input terminal 2 is supplied to the output terminal 3 exclusively through the P-channel field effect transistor 1.

Figure 4:
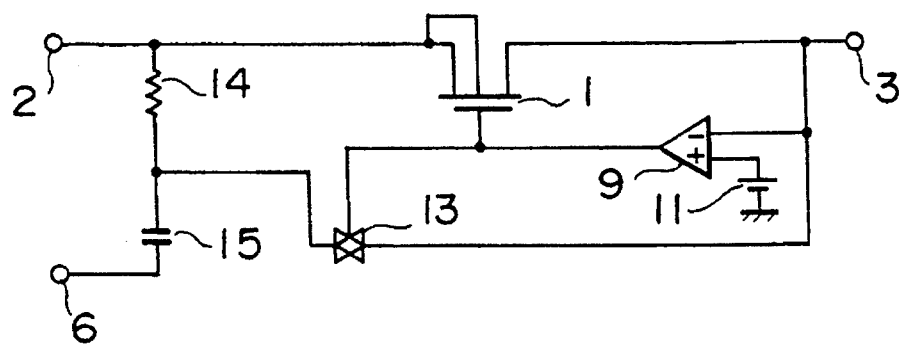
FIG. 4 is a circuit diagram showing the structure of a power source circuit according to a fourth embodiment of this invention.

FIG. 4 is a circuit diagram showing the structure of a power source circuit according to a fourth embodiment of this invention. A P-channel field effect transistor 1 is coupled across the input terminal 2 and the output terminal 3. On the other hand, a resistor 14 and a capacitor 15 are coupled serially across the input terminal 2 and the grounded terminal 6. The resistor 14 and the capacitor 15 constitute an integration circuit as described below. The junction point between the resistor 14 and the capacitor 15 is coupled through an analog switch 13 to the output terminal 3 and the inverted input terminal of a comparator 9. The output of the comparator 9 is coupled to the gate of the P-channel field effect transistor 1 and the control input terminal of the analog switch 13. On the other hand, the non-inverted input terminal of the comparator 9 is coupled to the constant voltage source 11.

The operation of the power source circuit of FIG. 4 is as follows. When the input terminal 2 is coupled to the power source, the voltage at the input terminal 2 is supplied through the resistor 14 and the analog switch 13 to the output terminal 3. Under this circumstance, the P-channel field effect transistor 1 is turned off, such that the voltage at the output terminal 3 is equal to the voltage developed across the terminals of the capacitor 15. As described above, the resistor 14 and the capacitor 15 are coupled serially across the input terminal 2 and the grounded terminal 6. Thus, the voltage developed across the terminals of the capacitor 15 is substantially proportional to the time integration of the current flowing the resistor 14. Thus, even if the voltage applied on the input terminal 2 rises sharply, the voltage at the output terminal 3 rises at the predetermined rising rate as determined by the integration circuit constituted by the resistor 14 and the capacitor 15.

When the voltage at the output terminal 3 further rises and the voltage at the inverted input terminal of the comparator 9 exceeds the voltage of the constant voltage source 11, the output of the comparator 9 fails to the low level L. Thus, the P-channel field effect transistor 1 is turned on, and, at the same time, the analog switch 13 is turned off, since the voltage applied on the control input terminal thereof falls to the low level L. Thereafter, a large current is supplied from the input terminal 2 to the output terminal 3 through the P-channel field effect transistor 1. Under this circumstance, the voltage drop across the input terminal 2 and the output terminal 3 is sufficiently small.

The output terminal 3 of the circuit of FIGS. 1 through 4 are coupled to a memory IC, etc. In the case where the memory IC must be continuously backed up by means of a battery, etc., for the prevention of the loss of information stored therein, a predetermined positive voltage is always applied on the output terminal 3. If, however, one of the circuits of FIGS. 1 through 4 are used alone as the power source circuit, the current may flow in the reverse direction from the output terminal 3 to the input terminal 2 due to the polarity of the P-channel field effect transistor 1.

Figure 5:
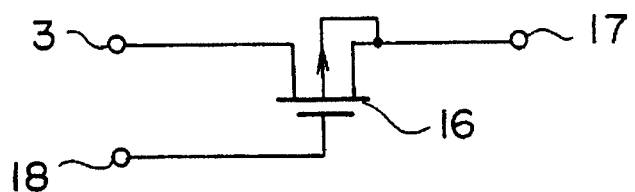
FIG. 5 is a circuit diagram showing a circuit adapted to be coupled to the latter stage of the circuits, for example, of FIGS. 1 through 3, for preventing a reverse current.
Figure 6:
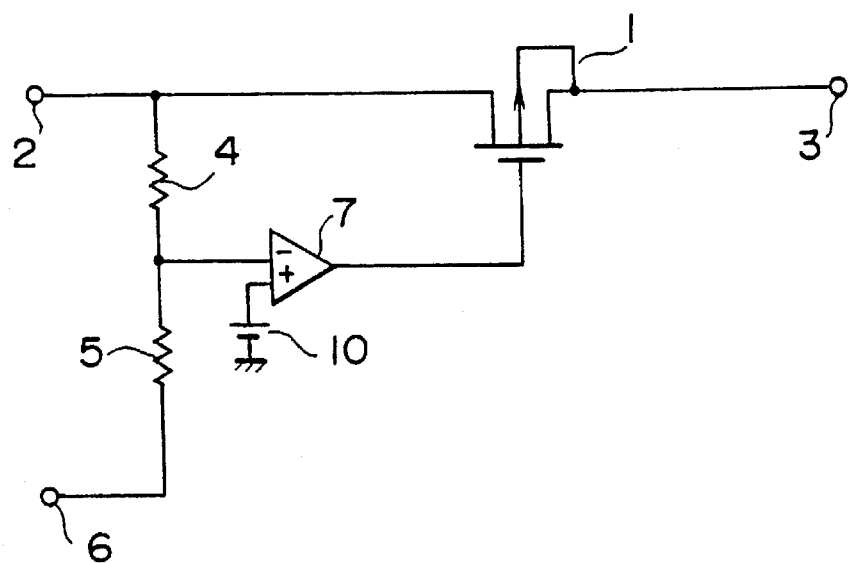
FIG. 6 is a circuit diagram showing the structure of a conventional power source circuit.

FIG. 5 is a circuit diagram showing a circuit adapted to be coupled to the latter stage of the circuits, for example, of FIGS. 1 through 3, for preventing a reverse current. The output terminal 3 of FIG. 5 is coupled to the output terminal 3 of one of the circuits of FIGS. 1 through 3. The source and the drain terminals of the P-channel field effect transistor 16 are coupled across the output terminal 3 and an exterior output terminal 17. The output terminal 17 is coupled to the backup power source for the memory IC, etc. The gate of the P-channel field effect transistor 16 is coupled through a gate signal input terminal 18 to the output of the comparator 7 of one of the circuits of FIGS. 1 through 3.

Thus, when the input terminal 2 is not coupled to the power source, the P-channel field effect transistor 16 is turned off, such that the reverse current from the exterior output terminal 17 to the output terminal 3 is prevented. When, on the other hand, the input terminal 2 is coupled to the power source, the output of the comparator 7 falls to the low level L, such that the P-channel field effect transistor 16 is turned on as the P-channel field effect transistor 8. Otherwise, the operation of the combination of the circuit of FIG. 5 with one of the power source circuits as described above is similar to that of the above respective embodiments.

What is claimed is:

1. A power source circuit for supplying a voltage applied on an input terminal to an output terminal at a limited rising rate, comprising:

a first transistor coupled between said input terminal and said output terminal;

a second transistor coupled across said input terminal and said output terminal in parallel circuit relationship with said first transistor, said second transistor having a smaller current driving capacity than said first transistor;

first control means for turning on said second transistor when said voltage upon said input terminal exceeds a first predetermined level, said first control means including a voltage detector means, coupled across said input terminal and a grounded terminal, for outputting a voltage corresponding to said voltage applied on said input terminal, and a first comparator having a first input terminal coupled to an output of said voltage detector means, and a second input terminal coupled to a reference constant voltage source, wherein an output of said first comparator is coupled to a control terminal of said second transistor and turns on said second transistor when said voltage applied upon said input terminal exceeds said first predetermined voltage level; and second control means for turning on said first transistor when said voltage at said output terminal exceeds a second predetermined level.

2. The power source circuit as claimed in claim 1, wherein said second transistor is a second field effect transistor and said control terminal of said second transistor is a gate terminal of said second field effect transistor.

3. A power source circuit as claimed in claim 1, wherein said second control means comprises:

a second comparator having a first input terminal coupled to said output terminal, and a second input terminal coupled to a reference constant voltage source, wherein an output of said second comparator is coupled to a control terminal of said first transistor and turns on said first transistor when said voltage at said output terminal exceeds said second predetermined voltage level.

4. The power source circuit as claimed in claim 3, wherein said first transistor is a first field effect transistor and said control terminal of said first transistor is a gate terminal of said first field effect transistor.

5. The power source circuit as claimed in claim 3, further comprising:

switch means inserted between said output of said first comparator and said control terminal of said second transistor, said switch means having a control input terminal coupled to said output of said second comparator, such that said output of said second comparator turns off said switch means at the same time when said output of said second comparator turns on said first transistor.

6. The power source circuit as claimed in claim 3, further comprising:

switch means inserted between said input terminal and said second transistor, said switch means having a control input terminal coupled to said output of said second comparator, such that said output of said second comparator turns off said switch means at the same time when said output of said second comparator turns on said first transistor.

7. The power source circuit as claimed in claim 1, further comprising:

a third transistor coupled serially with said first and second transistors, said third transistor preventing a reverse current flowing from said output terminal to said input terminal when turned off;

wherein said first control means turns on said second and third transistors when said voltage upon said input terminal exceeds a first predetermined level.

8. A power source circuit for supplying a voltage applied on an input terminal to an output terminal at a limited rising rate, comprising:

a transistor coupled between said input terminal and said output terminal;

integration circuit means connected between said input and output terminals and a ground terminal for supplying a voltage applied on said input terminal to said output terminal at a predetermined limited rising rate;

control means for turning on said transistor when said voltage at said output terminal exceeds a predetermined level, said control means including a comparator having a first input terminal coupled to said output terminal, and a second input terminal coupled to a reference constant voltage source, wherein an output of said comparator is coupled to a control terminal of said transistor and turns on said transistor when said voltage at said output terminal exceeds a predetermined voltage level.

9. A power source circuit for supplying a voltage applied on an input terminal to an output terminal at a limited rising rate, comprising:

a transistor coupled between said input terminal and said output terminal;

integration circuit means connected between said input and output terminals and a ground terminal for supplying a voltage applied on said input terminal to said output terminal at a predetermined limited rising rate;

control means for turning on said transistor when said voltage at said output terminal exceeds a predetermined level, said control means including a comparator having a first input terminal coupled to said output terminal, and a second input terminal coupled to a reference constant voltage source, wherein an output of said comparator is coupled to a control terminal of said transistor and turns on said transistor when said voltage at said output terminal exceeds a predetermined voltage level;

switch means inserted between said integration means and said output terminal, said switch means having a control input terminal coupled to an output of said control means, such that said control means turns off said switch means at the same time when said control means turns on said transistor.

* * * * *